United States Patent [19]

MacKinnon

[11] Patent Number: 4,791,370

[45] Date of Patent: Dec. 13, 1988

[54] GRADIENT FIELD STRUCTURE AND METHOD FOR USE WITH MAGNETIC RESONANCE IMAGING APPARATUS

[75] Inventor: Barry A. MacKinnon, Sunnyvale, Calif.

[73] Assignee: Resonex, Inc., Sunnyvale, Calif.

[21] Appl. No.: 768,873

[22] Filed: Aug. 23, 1985

[51] Int. Cl.⁴ .................................... G01R 33/20
[52] U.S. Cl. .................................... 324/318; 324/319; 324/307; 335/213
[58] Field of Search ............... 324/307, 309, 318, 319, 324/320; 335/213, 299; 336/200, 205, 206, 232

[56] References Cited

U.S. PATENT DOCUMENTS

| | | | |
|---|---|---|---|
| 2,935,691 | 5/1960 | Widröe | 336/232 |
| 3,199,021 | 8/1965 | Anderson | 324/320 |
| 3,234,632 | 2/1966 | Marley | 336/200 |
| 4,015,196 | 3/1977 | Moore et al. | 324/309 |
| 4,307,343 | 12/1981 | Likes | 324/307 |
| 4,310,799 | 1/1982 | Hutchison | 324/319 |
| 4,318,043 | 3/1982 | Crooks et al. | 324/309 |
| 4,500,860 | 2/1985 | Vermilyea | 324/320 |
| 4,621,236 | 11/1986 | Halbach | 324/319 |
| 4,639,671 | 1/1987 | Macovski | 324/309 |
| 4,654,591 | 3/1987 | Moran | 324/309 X |

FOREIGN PATENT DOCUMENTS 0884129  12/1961  United Kingdom ................ 324/320

OTHER PUBLICATIONS

W. A. Anderson, Electrical Current Shims for Correcting Magnetic Fields, Rev. Sci. Inst. vol. 32, No. 3 Mar. 1961.

*Primary Examiner*—Michael J. Tokar
*Attorney, Agent, or Firm*—Flehr, Hohbach, Test, Albritton & Herbert

[57] ABSTRACT

Magnetic imaging apparatus having a magnet providing a generally rectangular opening for receiving the object to be imaged and having first and second spaced apart substantially planar pole faces which are facing each other. First and second coil assemblies are disposed in the opening and provide a main magnetic field. First and second spaced apart substantially planar gradient field structures are disposed in the opening adjacent the pole faces and are adherent to the pole faces.

26 Claims, 6 Drawing Sheets

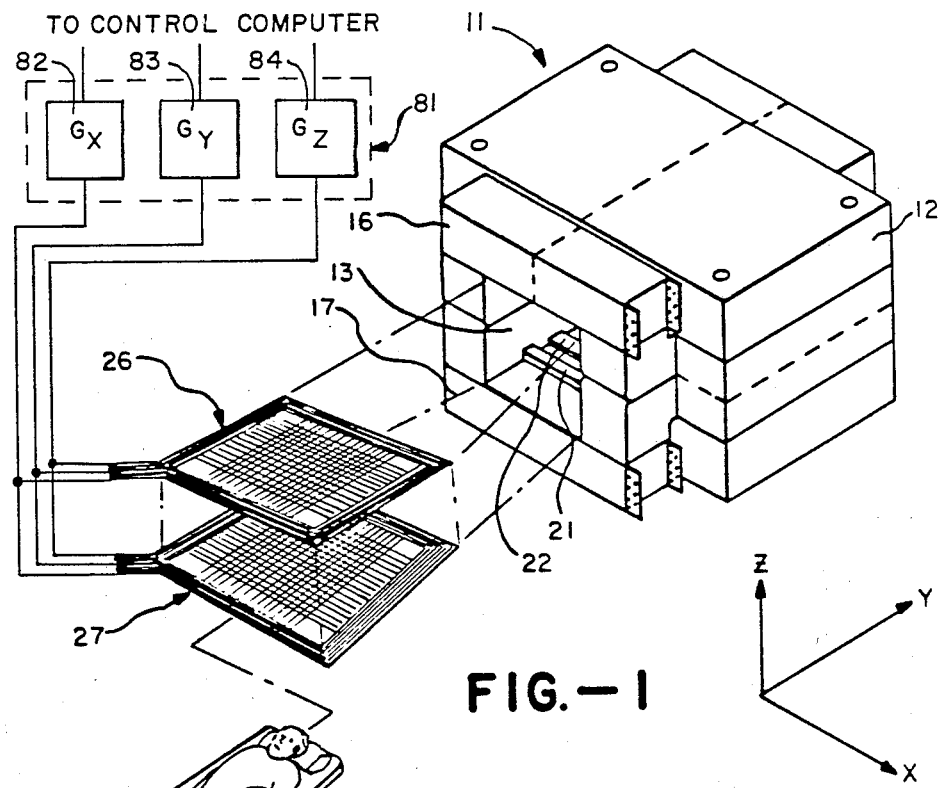
FIG.—1
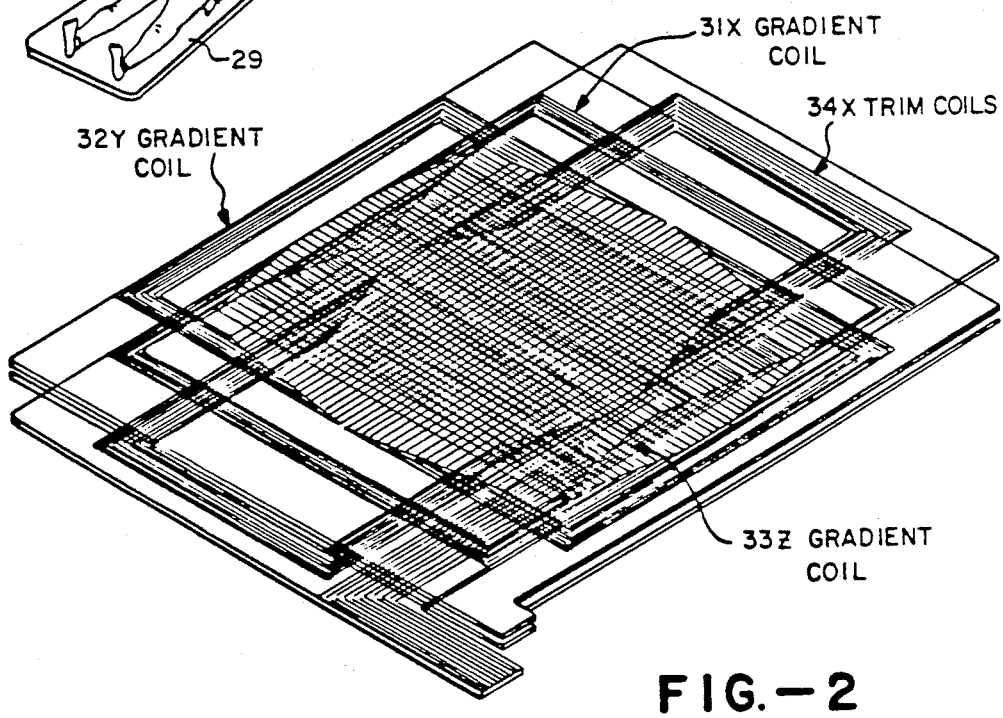
FIG.—2

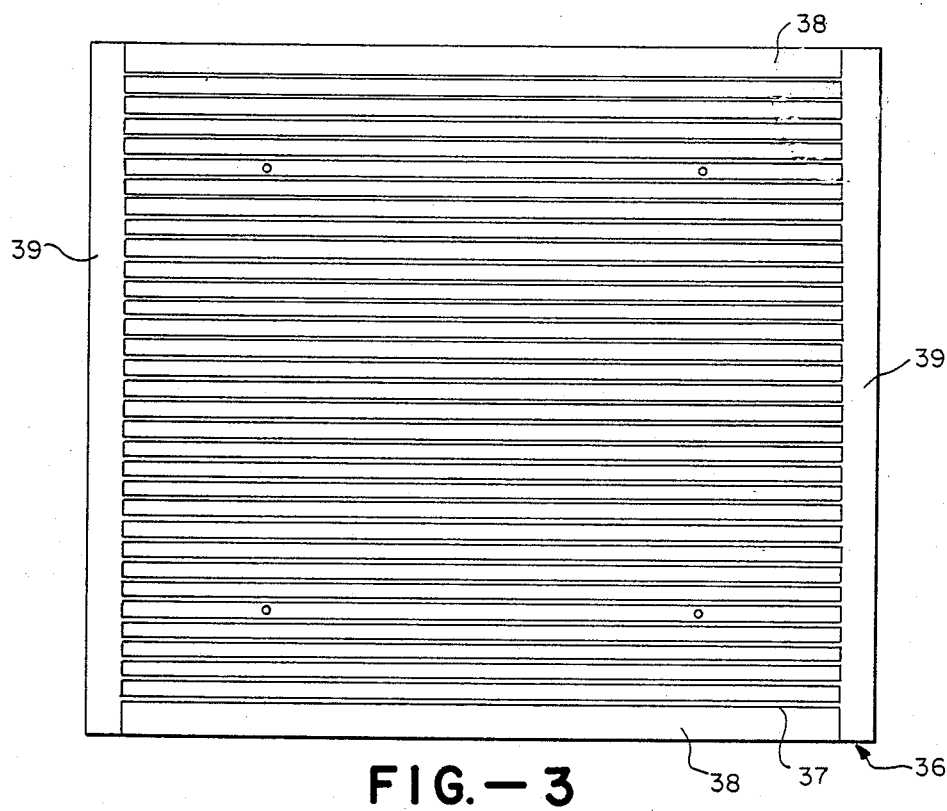
FIG.—3
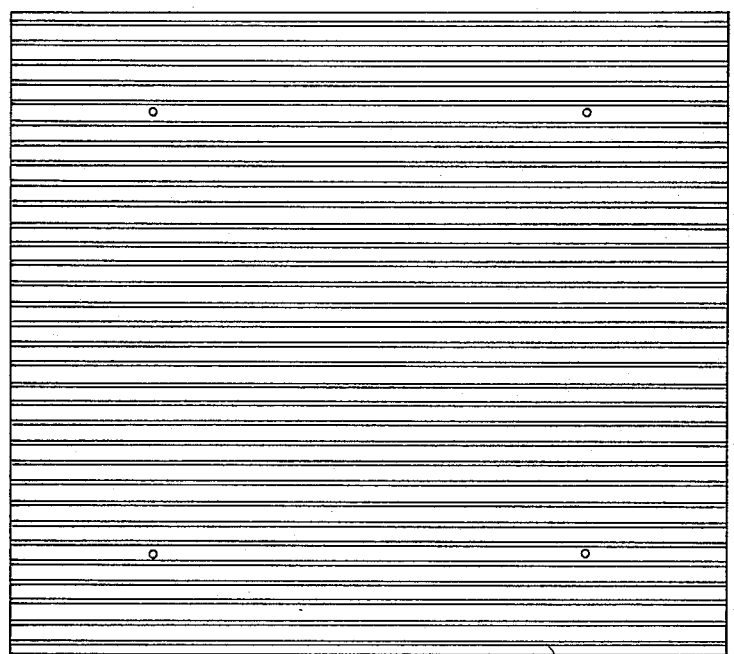
FIG.—4

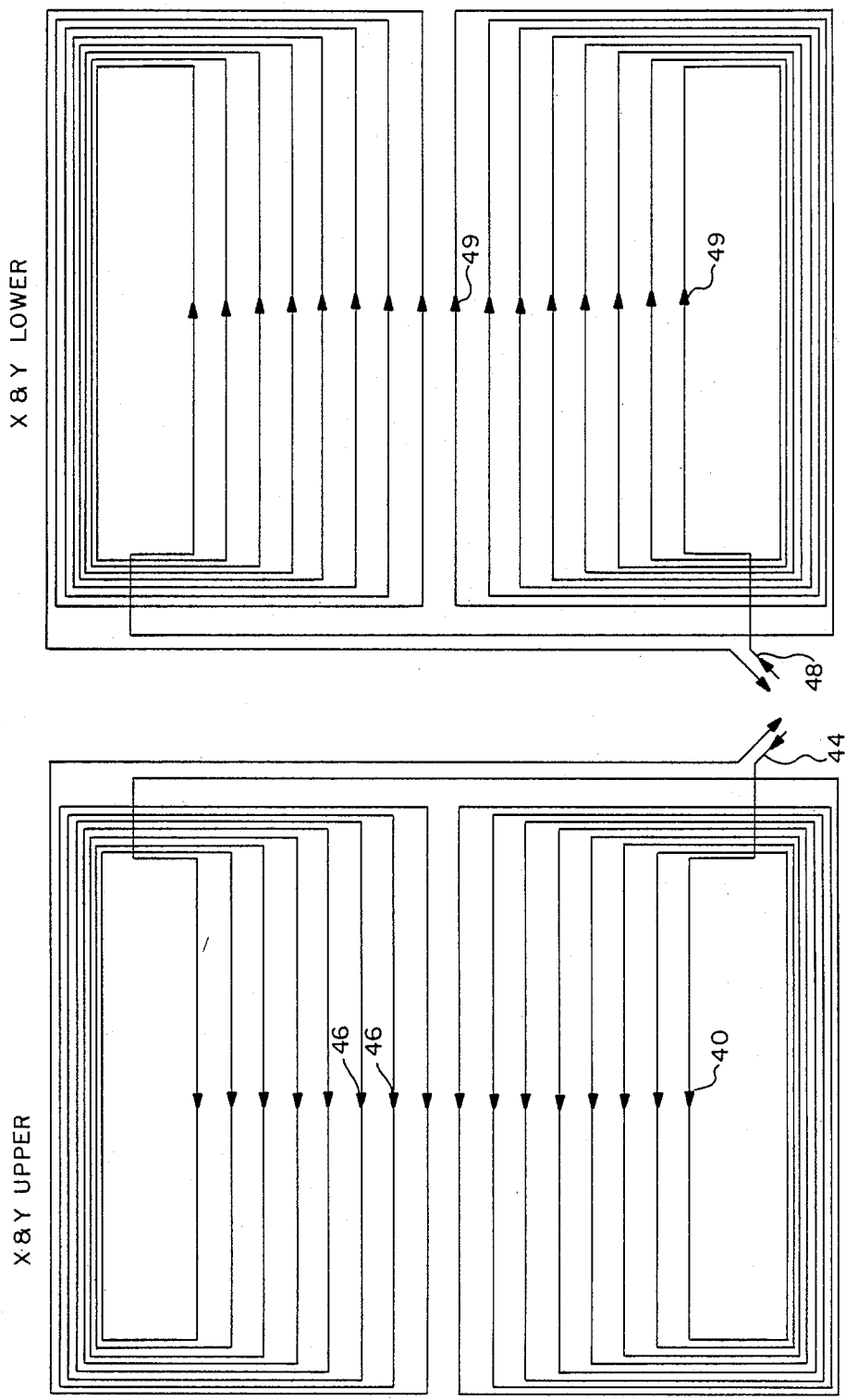
FIG.—6
FIG.—5

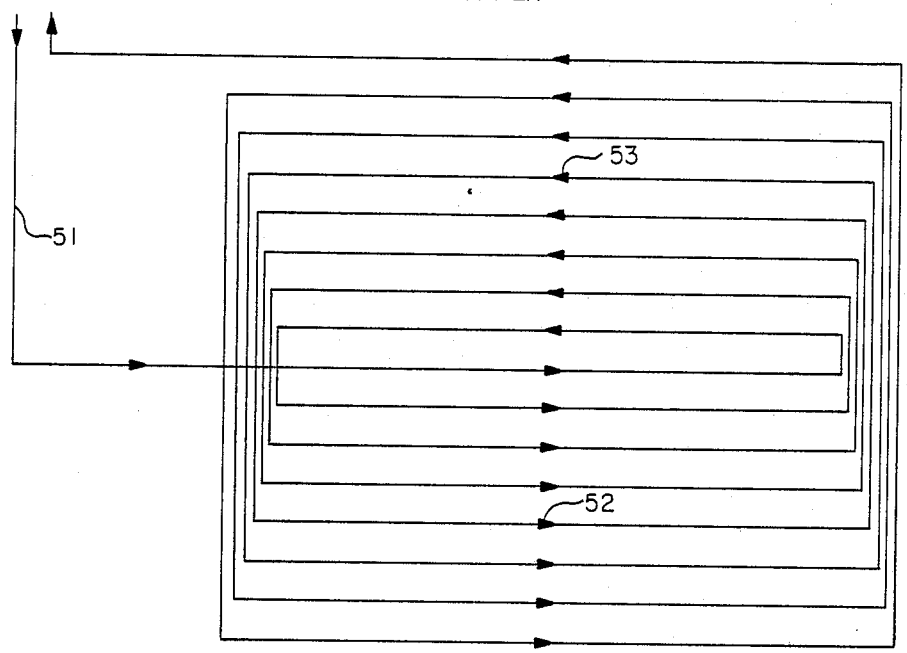
FIG. —7
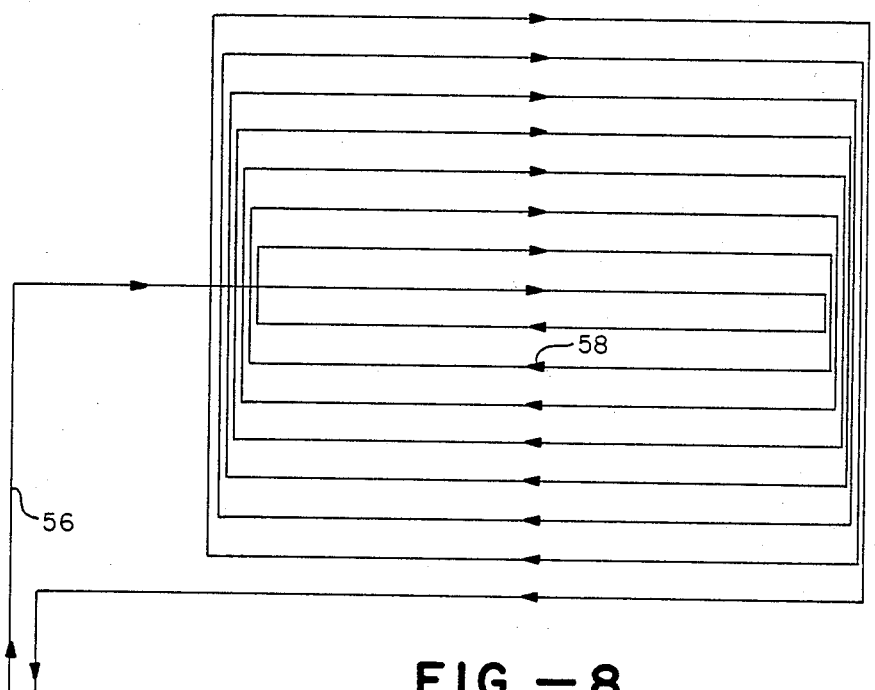
FIG. —8

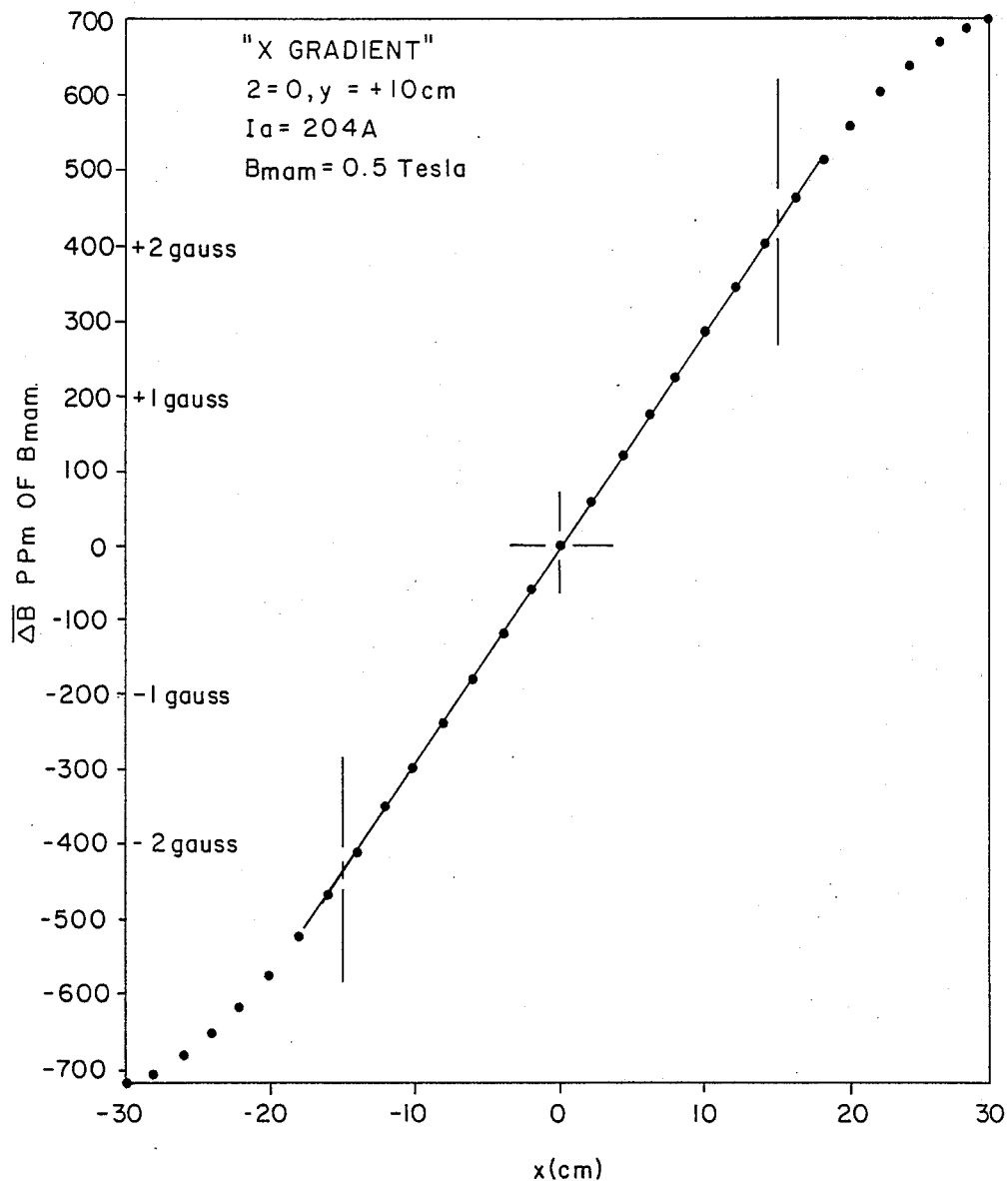
FIG. —10

GRADIENT FIELD STRUCTURE AND METHOD FOR USE WITH MAGNETIC RESONANCE IMAGING APPARATUS

This invention relates to an apparatus and method for producing magnetic field gradients and more particularly to a gradient field structure and method for use with magnetic resonance imaging apparatus.

Gradient coils for use on x, y and z axes have heretofore been provided in conjunction with magnetic resonance imaging apparatus. Heretofore such gradient coil structures have been mounted concentrically on a cylindrical tube. This has been found to be disadvantageous in that such a construction requires a large amount of space. In addition, such coil structures create large electrical currents which flow in a number of different directions that interact with the existing magnetic field and tend to create mechanical distortions. These distortions generate acoustical energy which create vibration and noise. There is therefore a need for a new and improved gradient field structure and method which overcomes the above-named disadvantages.

In general, it is an object of the present invention to provide an apparatus and method for producing magnetic field gradients for use with magnetic resonance imaging apparatus.

Another object of the invention is to provide an apparatus and method of the above character which does not obstruct the introduction of the sample into the imaging region of the apparatus.

Another object of the invention is to provide an apparatus and method of the above character in which the magnetic field gradients are created in planes parallel to the pole faces of the magnet structure.

Another object of the invention is to provide an apparatus and method of the above character in which the gradient fields are produced independently in three orthogonal directions in space.

Another object of the invention is to provide an apparatus of the above character in which the electrical conductors utilized for generating the magnetic gradient fields are disposed in a planar structure.

Another object of the invention is to provide an apparatus of the above character in which the planar structures carrying the gradient field conductors can be mounted directly against the pole faces.

Another object of the invention is to provide an apparatus of the above character in which the magnetic energy required for generating the gradient fields has been substantially reduced.

Another object of the invention is to provide an apparatus of the above character which greatly minimizes the production of acoustic energy when the gradient fields are varied rapidly in time.

Another object of the invention is to provide an apparatus of the above character in which current sheets or the equivalents of current sheets are utilized to obtain the required gradient fields.

Another object of the invention is to provide an apparatus of the above character which is relatively simple and easy to manufacture and easy to mount in the magnet structure to provide a minimum obstruction to the working volume of the magnet gap.

Another object of the invention is to provide an apparatus of the above character which is relatively compact.

Another object of the invention is to provide an apparatus of the above character in which the planar gradient field structures are relatively rigid.

Another object of the invention is to provide an apparatus and method of the above character which is relatively quiet in operation.

Additional objects and features of the invention will appear from the following description in which the preferred embodiments are set forth in detail with the accompanying drawings.

FIG. 1 is an isometric view of the magnet structure utilized in an magnetic resonance imaging apparatus having therein upper and lower gradient field structures which shown separated from the main magnet structure in a partially exploded view.

FIG. 2 is a phantom view of the x, y and z gradient coils—rotated by 90° in a horizontal—with the orientation shown in FIG. 1—as well as the x trim coils.

FIG. 3 is a plan elevational view of a sheet of epoxy glass laminate utilized for making the gradient field structure.

FIG. 4 is a plan view of an epoxy glass sheet similar to the one shown in FIG. 3 but omitting the wide channel.

FIG. 5 is a view showing the coil wire layout for the x and y coils for the upper gradient structure.

FIG. 6 is a view similar to FIG. 5 but showing the coil wire layout for the x and y coils for the lower gradient structure.

FIG. 7 shows the coil wire layout for the z gradient coil for the upper gradient coil structure.

FIG. 8 is a view showing the coil wire layout for the z gradient coil for the lower gradient structure.

FIG. 10 is a graph showing a typical measured gradient field.

Figure 9:
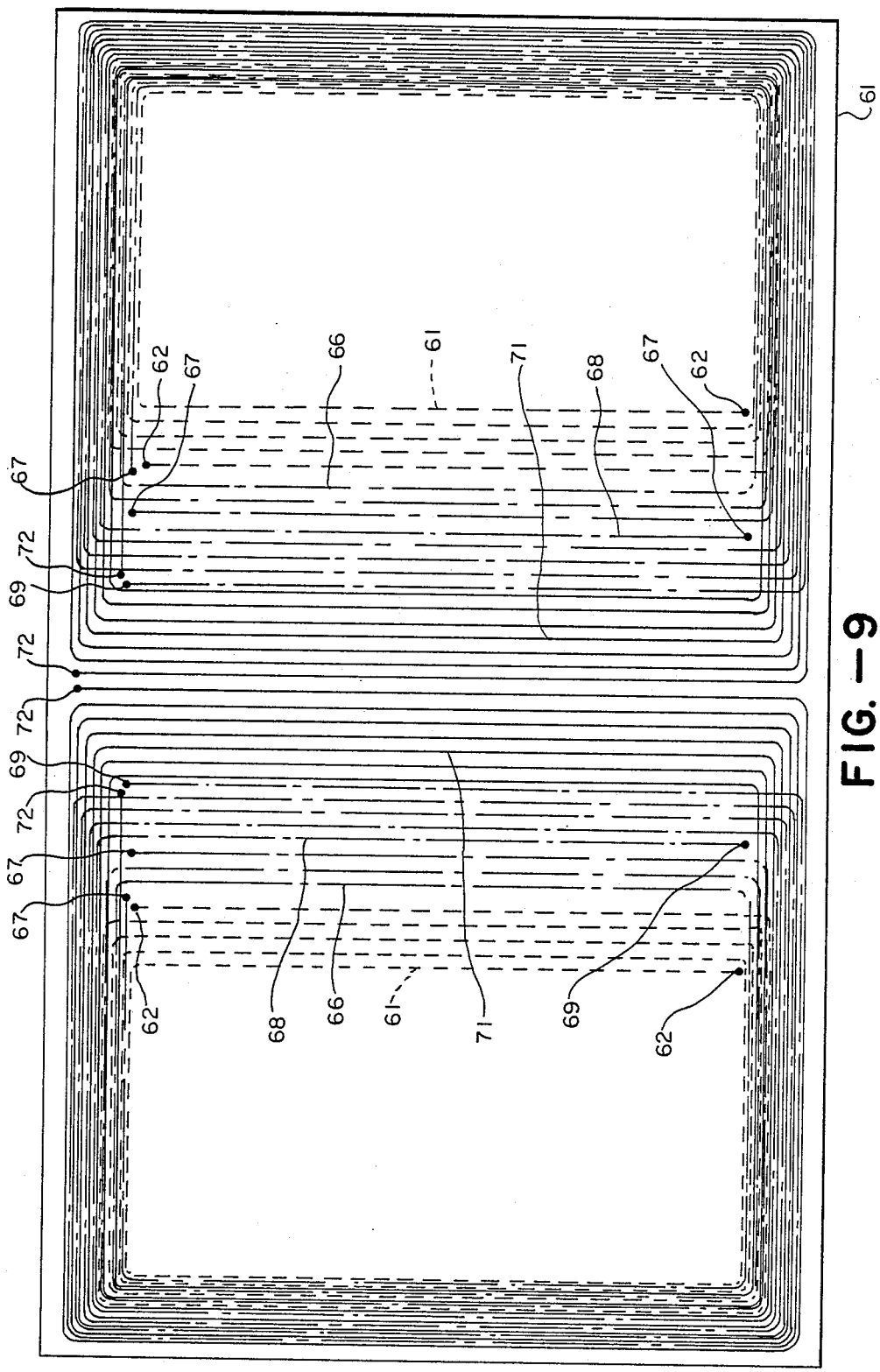
FIG. 9 is a plan view of the x trim coils utilized in the gradient structure.

In general, the magnetic resonance imaging apparatus of the present invention is comprised of a magnet providing a generally rectangular opening for receiving the object to be imaged and having first and second spaced apart parallel substantially planar pole faces which are facing each other. Coil assemblies are disposed in the opening end provide a main magnetic field. First and second spaced apart substantially planar gradient field structures are also disposed in the opening adjacent the pole faces.

More in particular as shown in FIGS. 1-9 of the drawings, the magnetic resonance imaging apparatus 11 of the present invention is comprised of low carbon steel magnet yoke 12 which provides a generally rectangular opening 13 for receiving the object such as a human body to be imaged. Upper and lower coil assemblies 16 and 17 are disposed within the opening and provide a main magnetic field for the imaging apparatus. The construction of the magnet yoke 12 and the upper and lower coil assemblies 16 and 17 is described in detail in copending application Ser. No. 768,872, filed Aug. 23, 1985. As also described in that copending application, the magnet yoke 12 is provided with first and second spaced apart parallel substantially planar pole faces which can be characterized as upper and lower pole faces. As also described therein, outer and inner shims 21 and 22 are provided in the pole faces. Upper and lower gradient field structures 26 and 27 are disposed in the opening 13 and are positioned adjacent to the upper and lower pole faces and abut the shims 21 and 22 provided on those pole faces.

In FIG. 1, the object to be imaged is a human body 28 which is carried by a support platform 29 that is adapted to be introduced into the opening 13 between the upper and lower gradient field structures 26 and 27 so that the human body can be imaged as hereinafter described.

A phantom view of one of the gradient field structures 26 and 27, as for example, the upper gradient field structure 26 is shown in FIG. 2 which shows the x, y and z gradient coils 31, 32 and 33 and the x trim coils 34. The coils 31 through 34 are substantially planar in configuration and are stacked one above the other as shown to provide a gradient field structure which is also substantially planar. The gradient field structures 26 and 27 can be secured to the pole faces by suitable means such as screws (not shown).

The coils 31 through 34 are mounted in an epoxy glass laminate sheets which is a conventional material utilized for printed circuit boards and the like. Thus by way of example there has been provided a sheet 36 shown in FIG. 3 which has a thickness of approximately 3 millimeters and dimensions of approximately 800 millimeters square. The sheet 36 is provided with a plurality of spaced apart parallel grooves 37. By way of example, 32 of such grooves can be provided which have a rectangular cross section of approximately 2 millimeters square and being spaced apart on centers approximately 16 millimeters. Wire grooves 38 are provided on the opposite sides of the sheet 36 and similarly wire grooves 39 are provided on opposite ends of the sheet 36. These wire grooves 38 and 39 can have suitable dimensions, as for example, they can be approximately 40 millimeters wide and have a two millimeter depth.

Another sheet 41 which is utilized is shown in FIG. 4. In many respects it is similar to the sheet which is shown in FIG. 3. It is provided with a plurality of spaced apart parallel grooves 42 which are two millimeters square in cross section and which are spaced apart on centers at 16 millimeters. Grooves corresponding to the grooves 38 and 39 provided in the sheet 36 shown in FIG. 3 have not been provided and for that reason the sheet 41 can have a smaller dimension than the sheet 36.

In FIG. 5 there is shown the wire layout for the x and y gradient coils for the upper gradient field structure 26. To form each of the coils, a single length of insulated wire 44 is taken and wound as shown in FIG. 5. The wire enters the sheet 36 at the lower right hand corner as viewed in FIG. 5 and is laid into the lowest of the grooves 37 and is then returned via the side groove 39, the bottom groove 38 and up the side groove 39 into the next lowermost groove 37. The first 16 of the grooves are filled with the wire in the manner described. It should be appreciated that in FIG. 5 only eight of the wires for the lower half of the coil are shown. The same procedure is obtained to provide 16 wires.

As soon as the lower half of the sheet 36 has been wound, the conductor 44 is carried upwardly as shown in FIG. 5 in the side channel 39 and is then positioned in the uppermost of the grooves 37. It is then returned through the side groove 39 to the top groove 38 and then to the side groove 39 to the uppermost groove 37. This procedure is continued until all 16 of the upper grooves have been filled with the wire 44 and then the wire is brought down along the side groove 39 and caused to exit from the sheet in generally the same position as the wire 44 enters the sheet. From the wire diagram shown in FIG. 5 it can be seen that all the wires lie in a single plane and that the current flow as indicated by the arrows 46 is in the same direction in the sheet 36, that is from right to left as viewed in FIG. 5.

The coil wire layout for the x and y coils for the lower gradient field structure 27 is shown in FIG. 6. A single length of wire 48 is wound in the manner shown in FIG. 6. The wire as shown enters the sheet 36 at the lower left-hand corner and is wound in the lowermost groove and is then returned in the side groove 39, the bottom groove 38 and up the side groove 39 into the next to lowermost groove. This procedure is continued until all 16 of the lower half of the grooves 37 have the length of wire 48 disposed therein after which wire is advanced to the uppermost of the grooves 37 and positioned therein after which it is returned through the side groove 39, the top groove 38 and the side groove 39 to return to be positioned in the next to the uppermost groove 37. This procedure is continued until all 16 of the upper half of the 32 grooves have been filled after which the length of wire 48 is returned to exit from the sheet 36 at the same point as which the wire enters as shown in FIG. 6. As can be seen, the wire 48 is positioned in the grooves 37 so that they all lie in a single plane and so that the current flows in the same direction as indicated by the arrows 49, that is, from left to right as viewed in FIG. 6.

The coil wire layout for the z gradient coils for the upper and lower gradient field structures 26 and 27 is shown in FIGS. 7 and 8 respectively. To provide the z gradient coil for the upper gradient field structure 27 a single length of wire 51 is taken and it is positioned in a sheet 41 in the grooves 42 in the manner shown in FIG. 7. As shown in FIG. 7, the wire enters the sheet 41 at the upper left hand corner as viewed in FIG. 7 and then is brought down so that it enters the groove 42 which is immediately below the center line of the sheet 41 and thereafter moves up the side margin to the groove 42 immediately above the center line and then is brought down to the next groove which is the second below the center line and then to the second above the center line. This procedure is continued until all 32 grooves have been filled with the length of wire 51 and the wire is brought out of the sheet at the upper left-hand corner as viewed in FIG. 7. Again as with the previous x and y gradient coils, the lengths of wire 51 which lie in the grooves 42 all lie in a single plane and are arranged in such a manner so that the current flow in the lower half of the sheet as viewed in FIG. 7 is in the direction indicated by the arrows 52 or in other words from the left hand side to the right hand side as viewed in FIG. 7 and the current flow in the upper one half is in the direction as indicated by the arrows 53 or in other words from the right hand side to the left hand side as viewed in FIG. 7.

The wire layout for the z gradient field for the lower gradient field support structure 28 is shown in FIG. 8. As shown therein, a single length of wire 56 is taken and enters the sheet 41 at the lower left-hand corner and is placed in the groove immediately above the center line of the sheet 41 and then is positioned into the groove immediately below the center line and then into the groove next above the center line of the board. This procedure is continued until all 32 grooves have been filled after which the length of wire is brought out at the lower left-hand corner of the sheet 41 as shown in FIG. 8. As with the previous coils, all of the lengths of the wire 56 which are disposed in the grooves 42 lie in a single plane and the wire has been wound in such a manner so that all of the wires lying in the grooves above the center line of the board have a current flow as indicated by the arrows 57 which is from left to right as viewed in FIG. 8 and the portions of the wire 56 lying in the grooves below the center line of the board have current flow in a direction as indicated by the arrows 58, or in other words, from the right to the left as viewed in FIG. 8.

It should be pointed out that the coils forming the upper and lower gradient field structures are connected in series. Thus the x gradient field for the upper circuit is connected in series to the x gradient field for the lower gradient structure so that the same identical current flows in both the upper and lower gradient structures.

The wires utilized for the x, y and z coils can be of a suitable type, as for example, 12 gauge insulated copper wire or copper wire having a diameter of approximately two millimeters.

It should be appreciated with respect to the x, y and z gradient coils which have hereinbefore been described in conjunction with the positioning of the conductors in grooves provided in epoxy glass laminate sheets that similar results can be obtained by utilizing printed circuit board techniques on which thin copper conductors can be formed on the printed circuit boards to provide the spaced parallel conductors lying in a single plane.

It also should be appreciated that in lieu of the sheets with grooves having conductors therein and also in lieu of printed circuit boards that the same effect can be achieved by utilizing single sheets to provide wide flat conductors to form the gradient fields. The single sheet can be utilized rather than an array of parallel wires. The same result can be achieved by taking a single sheet of a conducting material such as copper and supplying a current along one edge of the sheet to cause current flow to the other edge so that the current flow is in the same direction and lies in a single plane. However, by way of example if a current of 40 amperes is flowing in the wire utilized as a conductor in one of the gradient field coils hereinbefore described, this current would have to be multiplied by 32 to achieve the same result from a current flowing in a single sheet of material.

In fabricating the x trim coils 34, the printed circuit board technique has been found to be most appropriate. The trim coils can be considered to be shim coils which are utilized to correct the shape of the main magnetic field. The printed circuit (PC) board 61 which is utilized can be of a conventional composite multi-layer structure which is approximately 1¾ millimeters thick and which can be bonded to the two sheets 36 carrying the x and y gradient coils and the one sheet 41 carrying the z gradient coil by suitable means as an epoxy. This provides a gradient field structure having a thickness of 9 millimeters for the two sheets 36 and the one sheet 41 and the 1¾ millimeters for the PC board 61 for a total thickness of approximately 10¾ millimeters. Thus it can be seen that the PC board 61 carrying the x trim coils is bonded to and forms a part of the gradient field structures 26 and 27.

To form the trim coils, two single length conductors 62 have been provided on the right and left hand sides of the PC board 61 as shown in FIG. 9 and which are connected to plated through holes 63 provided in the PC board. These conductors can be considered to be positioned in layer 2 of the multi-layer PC board 61.

A pair of additional single length conductors 66 are provided in a third layer of a multi-layer board 61 as shown in FIG. 9 and are connected to plated through holes 67. Also in the third layer, two additional conductors 68 are provided which are wound in the manner shown and are connected to plated through holes 69.

Additional single length conductors 71 are provided on opposite sides of the PC board in the fourth layer of the multi-layer PC board and are connected to plated-through holes 71 as shown in FIG. 9. The first layer of the PC board 61 has not been shown. It merely provides a connection between the plated-through holes provided for the conductors and to connect them to the outside world. With the multi-layer PC board 61 it can be seen that there have been provided four independent circuits which makes it possible to make adjustments for more complex variations in the main magnetic field. The PC board layers which are shown in FIG. 9 merely show the trim coils for use in one of the gradient field structures. A similar trim coil arrangement would be provided for the other gradient field structure. The printed circuit board construction has been utilized for the trim coils because of the necessity of having the conductors run across each other. This can be readily accomplished by providing the conductors in various levels in the printed circuit board.

By providing these four independent sets of coils it can be seen that different current flows can be provided in the various sets of coils to achieve the maximum flexibility for compensating for complex variations in the main magnetic field. It can be seen that these four sets of trim coils serve as shimming coils which are incorporated in the planar gradient field structure. These four sets of coils are capable of producing gradients by means of current shimming.

After the two sheets 36 have been provided with the x and y gradient coils and the sheet 41 has been provided with the z gradient coils, the upper and lower field structures can be formed merely by bonding the sheets together in a suitable manner such as by an epoxy and also by placing on the same, the shimming coils by rigidly adhering the PC board 61 to the sheets 41 and 36. The composite assembly forming each of the upper and lower gradient field structures 26 and 27 can be inserted into the opening 13 and secured to the pole faces of the magnet yoke 12 by suitable fastening means with the inner and outer structural shims being disposed between the pole face and the upper and lower gradient field structures 26 and 27.

The currents hereinbefore described for exciting the gradient field structures 26 and 27 can be supplied by any suitable power supply means as represented by the power supply 81 in FIG. 1 comprised of three individual power supplies 82, 83 and 84 for the Gx, Gy and Gz gradient fields of a type well known to those skilled in the art. The power supply 81 is under the control of a control computer (not shown) and is used to create a set of three two-dimension quadrupole fields to produce approximately linear gradients in the magnitude of the large main field in each of three orthogonal directions as hereinafter described.

Operation and use of the magnetic resonance imaging apparatus may now be briefly described as follows. In consideration of the operation of the magnetic resonance imaging apparatus shown in FIG. 1, it should be appreciated that for a field which is invariant with respect to y the following equation must be satisfied:

$$\frac{\partial B_z}{\partial x} - \frac{\partial B_z}{\partial z} = 0 \tag{1}$$

-continued so that div $B = 0$

This is such that:

$$B_x = B_o x \text{ and } B_z = B_o z$$

which is the equivalent when written in polar coordinates of $$B = B_o r$$

such that $$B_r = B_o r \cos 2\theta \text{ and } B_\theta = B_o r \sin 2\theta \quad (2)$$

In utilizing the gradient fields established by the gradient coils hereinbefore described for magnetic resonance imaging purposes, the gradient fields are superposed on a substantially uniform static main field so that the total field at any point is the vector sum of the main field and the superimposed gradient field.

By way of example, the main field can be assumed to be aligned with the z axis. The field described above which is produced by the z gradient coils is that of a quadrupole field with its asymtotes coincident with the x and y axes. In such a configuration, the x component of the gradient field adds in quadrature to the main field having therefore very little influence on the total field magnitude provided the gradient fields are small compared with the main field. The net result is a total field which varies linearly with z to a very good approximation, i.e..

$$B_{total} \approx B_{main} + zB_o \quad (3)$$

It is similarly possible to produce a gradient of the z component of the total field with respect to x. To do so the x gradient coils described are used. The quadrupole field is then rotated through 45° so that its asymptotes bisect the angles between the x and y axes. In such situations, the gradient field comprises the components.

$$B_z = B_o x \quad B_x = B_o z \quad (4)$$

so that $$\frac{\partial B_z}{\partial x} - \frac{\partial B_z}{\partial z} = 0$$

so that curl $\vec{B} = 0$ as required.

In this case the field may be described in polar coordinates as $$B = B_o r$$

such that $$B_r = B_o r \sin 2\theta \text{ and } B_\theta = B_o r \cos 2\theta \quad (5)$$

As before with the x component ($B_x$) of the gradient field adds in quadrature to the main field and the main field to provide $$B_{total} \approx B_{main} + xB_o \quad (6)$$

Finally a y gradient field may be created such that $$B_{total} \approx B_{main} + yB_o \quad (7)$$

by rotating the x gradient field about the z axis by 90°. This by analogy, produces the field components $$B_z = B_o y \, B_y = B_o z \quad (8)$$

In this case, the $B_y$ component adds in quadrature to the main field and has little effect on the total field magnitude.

As is well known to those skilled in the art, the gradient fields in magnet resonance imaging apparatus are used to select a plane within the imaging volume in which the magnetic resonance frequencies of all of the protons in that plane are the same but are different from the protons which are not in that plane.

As pointed out above by the generation of the gradient fields in the present apparatus, there is automatically provided a field gradient which is in addition to the desired field gradient. By way of example if the z gradient is the one of interest there is necessarily an addition to the z gradient in the x field. However, since this x field is at right angles to the main field this x gradient has little effect on the main field and therefore its effect on the main field can be ignored. In terms of vector algebra, it can be stated that the curl of the magnetic field or curl B is equal to 0 in the absence of any currents and in any case the divergence of the magnetic field or div B is equal to 0. This can only occur when, if there is a gradient in one direction, there are simultaneous gradients in orthogonal directions.

It therefore has been shown that a set of three two-dimension quadrupole fields may be used to produce approximate linear gradients in the magnitude of a large main field in each of three orthogonal directions. By superimposing a linear combination of the three fields, a single linear gradient may be produced which is oriented in any arbitrary direction in space. Thus parallel current sheets of the present invention will produce fields which have approximately quadrupole symmetry near the central axis of the system. Thus an x gradient can be produced and by rotation a y gradient and similarly a z gradient can be produced. Such gradients can be readily achieved with the construction of the upper and lower gradient field structures hereinbefore described in which flat sheet-like conductors are utilized with uniform current distribution across the sheets and with appropriate connections. In the event that extensive currents are required in single sheet conductors, the use of the spaced parallel wires utilized in the present embodiment can be used to achieve the desired result.

In one embodiment of the invention, a structure incorporating all three gradients and providing up to 1200 Amperes total current was constructed and tested. The structure used 32 wires for each axis spaced at 16 millimeter centers. The wires were formed of enamel insulated copper having a diameter of approximately 2.05 millimeters embedded in grooves 3 millimeters in width formed in epoxy glass laminate sheets. A total of three of these sheets were used and bonded together to make a composite structure 800 millimeters square with a thickness of 9.5 millimeters. These gradient field structures were mounted upon the pole faces with a spacing between the structures of 400 millimeters. A driving current of 400 Amperes was utilized in the circuits and produced gradients linear to within 10% over a volume of approximately 30 centimeters cubed. The x and y gradients add 40 Amperes where about 1.0 Gauss per centimeter and the z gradient was approximately 1.5 Gauss per centimeter.

A typical measured gradient field is shown in FIG. 10. The abscissae are the x locations in centimeters whereas the ordinates represent the incremental field change in parts per million of the main field. The plotted points show the actual measured field distribution between the vertical bars which is a plus or minus 15 centimeters on the plot. It can be seen that there is a very linear change in field within these bars. Due to the finite width of the gradient structure, the linearity begins to decline outside of the bars. It has been found that the actual measured values as represented by FIG. 10 correspond very closely to computer simulations.

The 1200 Ampere gradient structure heretofore mentioned generated 1.0 Gauss per centimeter sinusoidal gradient field at 250 Hertz utilizing 300,000 volt Amperes of driving energy.

With the construction utilized in the present invention, it is easy to compute the approximate current required for a given gradient when the structures are mounted in a parallel pole iron core electromagnet. For the x and y gradients $$\text{gradient field} = \frac{\mu_o I'}{G} \text{ Tesla/m}.$$

For the z gradient $$\text{gradient field} = \frac{2\mu_o I'}{G} \text{ Tesla/m}.$$

where:
I' is the current per unit width across the active area of the structure (A/m)
G is one half the magnet gap (m)
$\mu_o$ is the permeability of free space (Henry/m)

The gradient field structures of the present invention can be used in DC operation to trim out linear gradients existing in the main field in order to improve the uniformity of the main field. Also by breaking up the gradient circuitry into separate independently excited sections, more complex imperfections in the main field may be trimmed out.

The magnetic resonance imaging apparatus and method of the present invention makes possible the use of a compact gradient field structures which are capable of generating strong gradients. Since the gradient field structures are in the form of planar sheet-like structures, they are easy to manufacture. They are also easy to mount. They provide a minimum of obstruction to the available working volume of the gap in the main magnet.

Since the directions of current flow are always perpendicular to the main field direction, the forces induced by the interaction of the gradient fields with the main field are always in the planes of the flat gradient structures. This flat gradient structure can be made very rigid and can be securely bonded or structurally secured to the magnetic pole faces. Since the forces which are created are always in the planes of the gradient field structures, minimal acoustic energy is produced.

The planar configurations of the gradient field structures lend themselves to use in iron core electromagnets with parallel pole faces. In such installations, the existence of "image currents" in the iron pole faces enhances the gradient magnitude achieved for a given current in the wires of the gradient field structure. Further, the magnetic energy is confined between the magnet poles and therefore largely to the region where the gradient fields are required. This reduces the electrical energy required to drive the gradient fields.

What is claimed is:

1. In a magnetic imaging apparatus, an electromagnet providing an opening for receiving the object to be imaged, said electromagnet having first and second coil assemblies providing a main magnetic field in the opening and first and second spaced apart substantially planar gradient field structures providing a set of three two-dimensional quadrupole fields in the opening, said gradient field structures comprising substantially parallel arrays of electrical conductors having substantially rectangular geometries lying in planes, the conductors having being distributed in space in each plane with respect to each other to provide a sheet-like current distribution in each plane.

2. Apparatus as in claim 1 wherein each of said gradient field structures includes an x gradient coil, a y gradient coil and a z gradient coil.

3. An apparatus as in claim 2 wherein each of said gradient field structures includes a plurality of planar trim coils having substantially rectangular geometries providing sheet-like current distributions.

4. Apparatus as in claim 3 wherein each of said x, y and z coils and said trim coils are provided in separate sheets which are superposed one above the other.

5. In a magnetic imaging apparatus, an electromagnet providing an opening for receiving the object to be imaged, said electromagnet having first and second coil assemblies providing a main magnetic field in the opening and first and second spaced apart substantially planar gradient field structures providing a set of three two-dimensional quadrupole fields in the opening, said gradient field structures comprising arrays of conductors having substantially rectangular geometries lying in planes, the conductors having being distributed in space in each plane with respect to each other to provide a desired current distribution in each plane, each of said gradient field structures including an x gradient coil, a y gradient coil and a z gradient coil, each of said gradient field structures also including a plurality of trim coils, each of said x, y and z coils and said trim coils being provided in separate superposed sheets, the x and y coils each being carried by a sheet of non-conducting material, a plurality of spaced parallel conductors carried by the sheet of non-conducting material in such a manner so that the current flow in the conductors is in the same direction.

6. Apparatus as in claim 5 wherein the z coil is carried by a sheet of non-conducting material and conductors arranged on the sheet of non-conducting material in such a manner so that the current travels in approximately one half the sheet in one direction and travels in the opposite direction in the other half of the sheet.

7. Apparatus as in claim 3 wherein the trim coils are formed in superposed layers.

8. Apparatus as in claim 2 in which the x and y coils in the first gradient structure and the x and y coils in the second gradient structure have currents flowing in opposite directions.

9. Apparatus as in claim 2 wherein the z gradient coils in the first and second gradient structures have currents flowing in opposite directions.

10. In a method for creating an image of an object disposed in a space by the use of magnetic resonance, creating a main magnetic field in the space, creating a set of three two-dimensional quadrupole fields in the space, each of the two dimensional quadrupole fields being formed by a plurality of substantially parallel current paths arranged in a substantially rectangular geometry lying in a plane to provide a sheet-like current distribution.

11. A method as in claim 10 together with the step of creating trim fields having a substantially rectangular geometry having a sheet-like current distribution.

12. A method as in claim 11 together with the step of varying the trim fields to correct for non-linearities in the main field.

13. In a magnetic resonance imaging apparatus for imaging an object, an electromagnet providing an opening forming a space having a central axis for receiving the object to be imaged and providing a main magnetic field in the opening, first and second gradient field structures lying in spaced apart planes and providing a set of three two-dimensional magnetic fields having approximately quadrupole symmetry near the central axis to produce approximately linear gradients in the main field in each of three orthogonal directions and, means linearly combining the three two-dimensional fields to superimpose upon the main magnetic field a single substantially linear gradient oriented in any desired arbitrary direction in the space formed by the opening.

14. In a magnetic resonance imaging apparatus for imaging an object, an electromagnet providing an opening forming a space having a central axis for receiving the object to be imaged and providing a main magnetic field in the opening and first and second gradient field structures providing a set of two-dimensional quadrupole magnetic fields having approximately quadrupole symmetry near the central axis to produce approximately linear gradients in the main field in each of three orthogonal directions whereby a linear combination of the three fields can be created to superimpose upon the main magnetic field a single substantially linear gradient oriented in any desired arbitrary direction in the space formed by the opening, each of the gradient field structures being comprised of a plurality of arrays of conductors lying in substantially parallel planes, the conductors in each plane having at least portions thereof spaced apart and parallel to each other to form current sheets.

15. Apparatus as in claim 14 wherein the current sheets have substantially uniform current distributions across the sheets.

16. In a magnetic resonance imaging apparatus for imaging an object, an electromagnet providing an opening forming a space having a central axis for receiving the object to be imaged and providing a main magnetic field in the opening, first and second gradient field structures lying in spaced apart planes and providing a set of three two-dimensional magnetic fields having approximately quadrupole symmetry near the central axis to produce approximately linear gradients in the main field in each of three orthogonal directions, and means linearly combining the three two-dimensional fields to superimpose upon the main magnetic field a single substantially linear gradient oriented in any desired arbitrary direction in the space formed by the opening, the gradient field structures being comprised of planar sheet-like structures, each of the sheet-like structures including an array of conductors lying in a substantially parallel plane and wherein at least portions of the conductors are spaced apart and parallel to each other.

17. Apparatus as in claim 16 wherein said array of conductors has a rectangular geometry.

18. In a magnetic resonance imaging apparatus for imaging an object, an electromagnet providing an opening forming a space having a central axis for receiving the object to be imaged and providing a main magnetic field in the opening and first and second gradient field structures providing a set of two-dimensional quadrupole magnetic fields having approximately quadrupole symmetry near the central axis to produce approximately linear gradients in the main field in each of three orthogonal directions whereby a linear combination of the three fields can be created to superimpose upon the main magnetic field a single substantial linear gradient oriented in any desired arbitrary direction in the space formed by the opening, the gradient field structures being positioned so that the forces introduced by the interaction of the gradient fields with the main field are in the planes of the gradient field structures.

19. Apparatus as in claim 18 wherein the electromagnet includes parallel spaced apart pole faces.

20. Apparatus as in claim 19 wherein the gradient field structures are secured to the pole faces.

21. In a method for magnetic resonance imaging of an object in a space defined by an opening, creating a main magnetic field in the space, creating a set of three quadrupole fields to establish approximately linear gradients in the main field in each of three orthogonal directions and combining the three quadrupole fields linearly to create a substantially linear gradient on the main field which can be oriented in any desired arbitrary direction in the space.

22. A method as in claim 21 together with the step of in a method for magnetic resonance imaging of an object in a space defined by an opening, creating a main magnetic field in the space, creating a set of three quadrupole fields to establish approximately linear gradients in the main field in each of three orthogonal directions combining the three quadrupole fields linearly to create a substantially linear gradient on the main field which can be oriented in any desired arbitrary direction in the space and adjusting the gradient fields to trim the uniformity of the main field.

23. A method as in claim 22 together with the step of dividing the gradient fields into sections to facilitate trimming of the main field.

24. A method as in claim 21 wherein the gradient fields are created by superposed current sheets.

25. A method as in claim 24 wherein the current sheets have a substantially uniform current distribution.

26. In a magnetic resonance imaging apparatus for imaging an object, an electromagnet providing an opening forming a space having a central axis for receiving the object to be imaged and providing a main magnetic field in the opening, first and second gradient field structures lying in spaced apart planes and providing a set of three two-dimensional magnetic fields having approximately quadrupole symmetry near the central axis to produce approximately linear gradients in the main field in each of three orthogonal directions and means linearly combining the three two-dimensional fields to superimpose upon the main magnetic field a single substantially linear gradient oriented in any desired arbitrary direction in the space formed by the opening, each of the gradient field structures being formed in sections and each being electrically excited independently to facilitate trimming of the main field.

* * * * *